United States Patent
Mohr et al.

(10) Patent No.: US 7,145,817 B2
(45) Date of Patent: Dec. 5, 2006

(54) REDUCED POWER REDUNDANCY ADDRESS DECODER AND COMPARISON CIRCUIT

(75) Inventors: Christian N. Mohr, Richardson, TX (US); Scott E. Smith, Plano, TX (US)

(73) Assignee: Micron Technology, Inc., Boise, ID (US)

(*) Notice: Subject to any disclaimer, the term of this patent is extended or adjusted under 35 U.S.C. 154(b) by 80 days.

(21) Appl. No.: 11/015,703

(22) Filed: Dec. 17, 2004

(65) Prior Publication Data

US 2005/0099861 A1    May 12, 2005

Related U.S. Application Data

(63) Continuation of application No. 10/613,305, filed on Jul. 2, 2003, now Pat. No. 6,868,019.

(51) Int. Cl.
*G11C 7/00* (2006.01)

(52) U.S. Cl. .............. 365/200; 365/189.07; 365/225.7

(58) Field of Classification Search ............. 365/200, 365/189.07, 225.7, 230.03, 230.08, 185.09, 365/189.08
See application file for complete search history.

(56) References Cited

U.S. PATENT DOCUMENTS

| | | | |
|---|---|---|---|
| 5,239,511 A | 8/1993 | Oh | 365/227 |
| 5,295,101 A | 3/1994 | Stephens, Jr. et al. | 365/200 |
| 5,311,472 A | 5/1994 | Ota | 365/200 |
| 5,337,278 A | 8/1994 | Cho | 365/200 |
| 5,471,426 A | 11/1995 | McClure | 365/200 |
| 5,724,295 A | 3/1998 | Beiley et al. | 365/222 |
| 5,787,043 A * | 7/1998 | Akioka et al. | 365/200 |
| 5,848,006 A | 12/1998 | Nagata | 365/230.06 |
| 5,867,433 A | 2/1999 | Shen et al. | 365/200 |
| 6,018,811 A | 1/2000 | Merritt | 714/711 |
| 6,301,164 B1 | 10/2001 | Manning et al. | 365/200 |
| 6,314,030 B1 | 11/2001 | Keeth | 365/200 |
| 6,400,618 B1 | 6/2002 | Nakamura et al. | 365/200 |
| 6,424,584 B1 | 7/2002 | Seyyedy | 365/225.7 |
| 6,434,064 B1 | 8/2002 | Nagai | 365/200 |
| 6,466,493 B1 | 10/2002 | Menke et al. | 365/200 |
| 6,519,192 B1 | 2/2003 | Ooishi | 365/200 |
| 6,552,937 B1 | 4/2003 | Ladner et al. | 365/200 |
| 6,724,670 B1 | 4/2004 | Jones et al. | 365/200 |
| 6,781,900 B1 * | 8/2004 | Furutani et al. | 365/201 |
| 2003/0174568 A1 | 9/2003 | Blodgett | 365/225.7 |

* cited by examiner

*Primary Examiner*—Son T. Dinh
*Assistant Examiner*—Dang Nguyen
(74) *Attorney, Agent, or Firm*—Dorsey & Whitney LLP

(57) ABSTRACT

A redundancy address decoder for a memory having at least one bank of memory segmented into a plurality of memory blocks. The redundancy address decoder includes a plurality of redundancy comparison circuitry coupled to a respective programmable element block storing addresses that are mapped to redundant memory of a memory plane. The redundancy address decoder further includes redundancy driver select logic coupled to each of the redundancy comparison circuitry to activate a selected one of the redundancy comparison circuitry for comparing a portion of a memory address corresponding to a memory location with the programmed addresses of the respective programmable element blocks, which leads to power reduction for column accesses to the memory device. The selection of the redundancy driver is based on the memory bank in which the memory location is located.

21 Claims, 4 Drawing Sheets

REDUCED POWER REDUNDANCY ADDRESS DECODER AND COMPARISON CIRCUIT

CROSS-REFERENCE TO RELATED APPLICATION

This application is a continuation of U.S. patent application Ser. No. 10/613,305, filed Jul. 2, 2003 now U.S. Pat. No. 6,868,019.

TECHNICAL FIELD

The present invention relates generally to semiconductor memory devices, and more specifically, to a redundancy address decoder and comparison circuit for a memory device having redundant memory.

BACKGROUND OF THE INVENTION

Typical integrated memory devices include arrays of memory cells arranged in rows and columns. In many such memory devices, several redundant rows and columns are provided to replace malfunctioning memory cells found during testing. Testing is typically performed by having predetermined data values written to selected row and column addresses that correspond to memory cells. The memory cells are then read to determine if the data read matches the data written to those memory cells. If the read data does not match the written data, then those memory cells are likely to contain defects which will prevent proper operation of the memory device.

The defective memory cells may be replaced by enabling the redundant circuitry. A malfunctioning memory cell in a column or a row is substituted with a column or row of redundant memory cells. Therefore, a memory device need not be discarded even though it contains defective memory cells. Substitution of one of the redundant rows or columns is accomplished in a memory device by programming a specific combination of fuses, or if the memory device uses antifuses, by programming a specific combination of antifuses, located in one of several fuse or antifuse blocks in the memory device. Conventional fuses are resistive devices which may be opened or broken with a laser beam or an electric current. Antifuses are capacitive devices that may be closed or blown by breaking down a dielectric layer in the antifuse with a relatively high voltage.

A specific combination of antifuses are programmed to correspond to an address of a row or column having defective memory cells. For example, if the defective row or column has a 11-bit binary address of 10010010010, then the antifuses in a set of 11 antifuses are programmed to store this address. The sets of antifuses are typically arranged in an antifuse block with the number of antifuses equal to the product of the number of address bits per a row or column address and the number of redundant rows or columns available for memory repair. The memory device contains several antifuse blocks, each block typically corresponding to a redundancy "plane," that defines the available redundant memory associated with a particular portion of a memory array. For example, the memory array of modern memory devices are often divided into individually addressable banks of memory, with each bank of memory typically further segmented into smaller regions, or blocks of memory. Each memory block includes a limited amount of redundant rows and columns of memory that can be used to repair defective memory in the memory block. An antifuse block is used to program the rows and columns of memory for the memory block that are mapped to redundant rows and columns of memory, respectively.

Each row or column address received by a memory device is compared to the programmed addresses that have been mapped to redundant row or column memory, respectively. Comparison of received memory addresses to the programmed addresses of the antifuse blocks is transparent to the user and is made by redundancy decoder circuitry coupled to the antifuse blocks. The redundancy decoder circuitry includes redundancy comparison logic for each antifuse block in a bank of memory. As previously discussed, a bank of memory is typically subdivided into blocks of memory, each of which has an antifuse block for programming the row and column addresses of memory within the memory block that will be mapped to redundant rows and columns of memory in the associated redundancy plane. When row and column addresses for an activated bank of memory are received, they are compared by the redundancy comparison logic for each of the antifuse blocks. If an address match is detected by one of the redundancy comparison logic, a match signal MATCH is generated to indicate that memory has been remapped to redundant memory for that memory block and the MATCH signal is provided to an address decoder, either row or column, to activate the appropriate row or column of redundant memory. After comparison, the row of memory corresponding to the row address, or the redundant row of memory to which the row address is mapped, is activated for one of the memory blocks, and the column of memory corresponding to the column address, or the redundant column of memory to which the column address is mapped is activated for the same memory block. A memory operation is then performed on the accessed memory location at the intersection of the selected row and column of memory.

As the memory address changes, and each new address is compared against the addresses programmed in each antifuse block, switching currents result from each new address applied to the redundancy comparison logic. Although only one block of memory will have the memory location corresponding to the row and column address, the memory addresses are nevertheless compared to the addresses programmed in each antifuse block of an activated bank of memory. For example, after decoding a row address and activating the row of memory in one of the memory blocks of a bank of memory, the column address will be compared to the addresses programmed in all of the antifuse blocks of the bank of memory, although the activated row of memory is associated with only one of the memory blocks. The switching currents resulting from the comparison of the column address by the redundancy comparison circuits for the antifuse blocks of all the other memory blocks of the bank of memory results in unnecessary power consumption. The problem with switching currents is exacerbated by "burst modes" of synchronous memory devices where a row of memory remains activated while new column addresses are provided every clock cycle in order to quickly read data from or write data to the activated row of memory. With each new column address, the switching currents from the unnecessary comparison of the column addresses by the redundancy comparison circuits for the memory blocks not having the activated row of memory are wasted.

Therefore, where minimizing unnecessary power consumption is desirable, alternative methods and systems for performing address comparison to addresses programmed by fuses, or antifuses, such as in memory applications for programming redundant memory, would be preferable.

SUMMARY OF THE INVENTION

In one aspect of the invention, a redundancy address decoder for a memory having redundant memory is provided. The redundancy address decoder includes a plurality of address comparison circuits to compare a first portion of a memory address to programmed address of respective programmable element blocks and to generate a match signal in response to detecting an address match with one of the programmed addresses. The programmed addresses corresponding to memory addresses mapped to the redundant memory. The redundancy address decoder further includes a plurality of address driver circuits. Each of the driver circuits is associated with a respective one of the comparison circuits and provides the first portion of the memory address to the respective address comparison circuits when enabled. A driver select logic is coupled to the plurality of address driver circuits and enables a selected one of the address driver circuits in accordance with a second portion of the memory address.

In another aspect of the invention a method for accessing a memory location corresponding to a memory address is provided. A block of memory in which the memory location is located is determined from a first portion of the memory address. A comparison memory address corresponding to a second portion of the memory address is generated for comparison with stored memory addresses of defective memory locations of the block of memory in which the memory location is located. Null memory addresses are generated from the second portion of the memory address for comparison with the stored memory addresses of defective memory locations in other blocks of memory. In response to the comparison memory address matching any of the stored memory addresses for the block of memory in which the memory location is located, a redundant memory location to which the matching address is mapped is accessed. Otherwise, the memory location in the block of memory corresponding to the memory address is accessed.

DETAILED DESCRIPTION OF THE INVENTION

Embodiments of the present invention provide a redundancy address decoder that avoids unnecessary switching currents that occur during the comparison of memory addresses to programmed addresses of memory locations mapped to redundant memory. Certain details are set forth below to provide a sufficient understanding of the invention. However, it will be clear to one skilled in the art that the invention may be practiced without these particular details. In other instances, well-known circuits, control signals, and timing protocols have not been shown in detail in order to avoid unnecessarily obscuring the invention.

Figure 1:
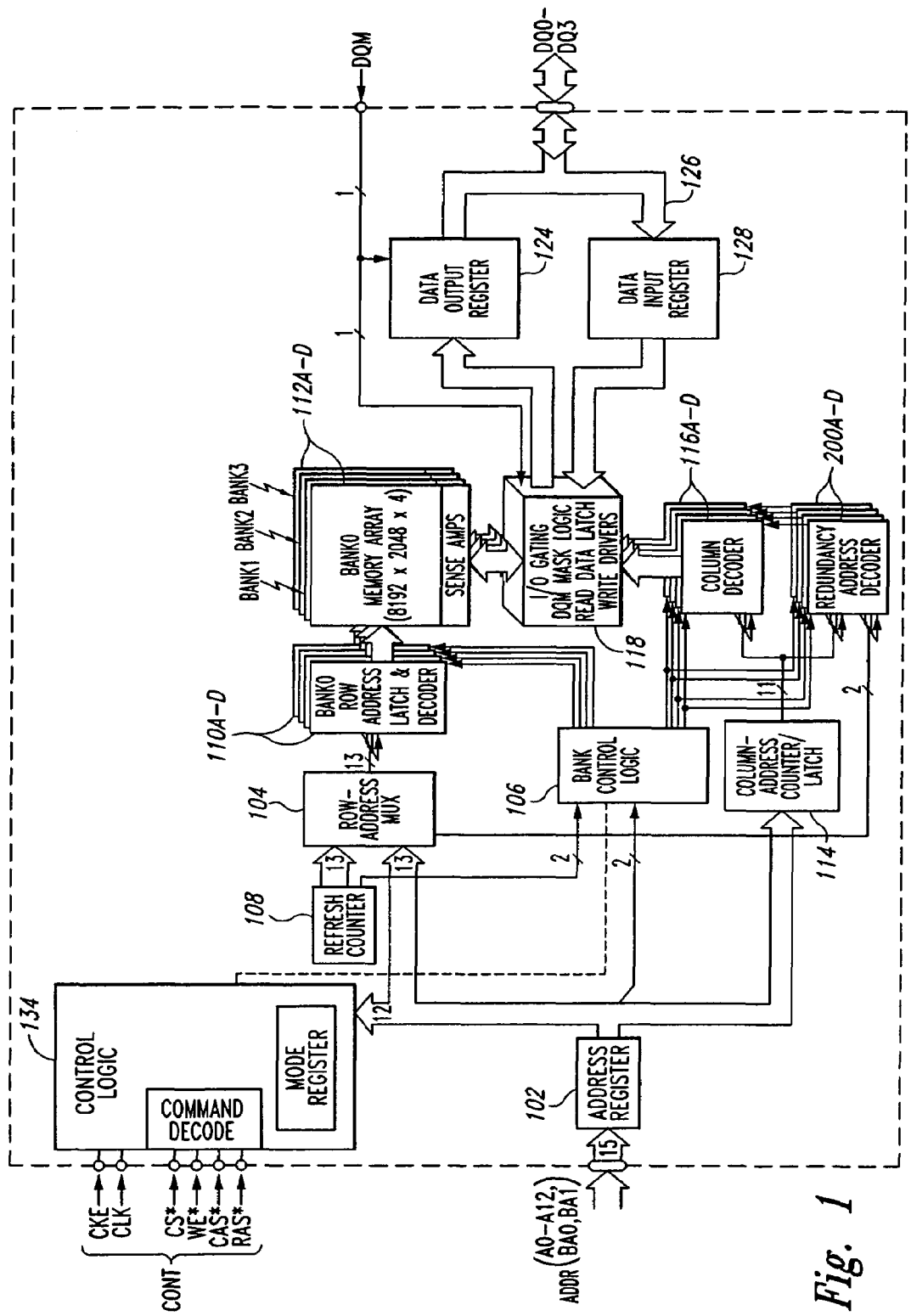
FIG. 1 is a functional block diagram of a synchronous memory device including a redundancy address decoder according to an embodiment of the present invention.

FIG. 1 is a functional block diagram of a memory device 100 including a redundancy address decoder 200 according to an embodiment of the present invention. As will be explained in more detail below, the memory device 100 in FIG. 1 is a double-data rate (DDR) synchronous dynamic random access memory ("SDRAM"), although the principles described herein are applicable to any memory device that may include redundancy memory, such as conventional synchronous DRAMs (SDRAMs), as well as packetized memory devices like SLDRAMs and RDRAMs.

The memory device 100 includes an address register 102 that receives row, column, and bank addresses over an address bus ADDR, with a memory controller (not shown) typically supplying the addresses. The address register 102 receives a row address and a bank address that are applied to a row address multiplexer 104 and bank control logic circuit 106, respectively. The row address multiplexer 104 applies either the row address received from the address register 102 or a refresh row address from a refresh counter 108 to a plurality of row address latch and decoders 110A–D. The row address multiplexer 104 applies the refresh row address from the refresh counter 108 to the decoders 110A–D and the bank control logic circuit 106 uses the refresh bank address from the refresh counter when the memory device 100 operates in an auto-refresh or self-refresh mode of operation in response to an auto- or self-refresh command being applied to the memory device 100, as will be appreciated by those skilled in the art. The bank control logic 106 activates the row address latch and decoder 110A–D corresponding to either the bank address received from the address register 102 or a refresh bank address from the refresh counter 108, and the activated row address latch and decoder latches and decodes the received row address. In response to the decoded row address, the activated row address latch and decoder 110A–D applies various signals to a corresponding memory bank 112A–D to thereby activate a row of memory cells corresponding to the decoded row address.

A column address is applied on the ADDR bus after the row and bank addresses, and the address register 102 applies the column address to a column address counter and latch 114 which, in turn, latches the column address and applies the latched column address to a plurality of column decoders 116A–D. The bank control logic 106 activates the column decoder 116A–D corresponding to the received bank address, and the activated column decoder decodes the applied column address. Depending on the operating mode of the memory device 100, the column address counter and latch 114 either directly applies the latched column address to the decoders 116A–D, or applies a sequence of column addresses to the decoders starting at the column address provided by the address register 102. In response to the column address from the counter and latch 114, the activated column decoder 116A–D applies decode and control signals to an I/O gating and data masking circuit 118 which, in turn, accesses memory cells corresponding to the decoded column address in the activated row of memory cells in the memory bank 112A–D being accessed.

Each memory bank 112A–D includes a memory-cell array having a plurality of memory cells arranged in rows and columns. The memory banks 112A–D are segmented in memory blocks (not shown), each of which has an associated redundancy memory plane having redundant rows and columns of memory to which memory addresses within the memory block can be mapped to replace defective memory locations in the respective memory block. Mapping of memory addresses for a memory block is accomplished by programming the memory addresses of defective memory locations in an antifuse block (not shown) associated with the memory block. In determining whether a memory address has been mapped to redundant memory, the row and column addresses received by the memory device 100 are compared to the addresses programmed in the antifuse blocks. In an embodiment of the present invention, redundancy address decoders 200A–D are used to compare every column address applied to the memory device 100 in order to determine whether the column address of a memory block has been mapped to a redundant column of memory in the respective redundancy plane.

The redundancy address decoders 200A–D receive the column addresses in parallel with the column decoders 116A–D. The redundancy address decoders 200A–D further receive a portion of the row address from the row address multiplexer 104. For the embodiment of the present invention shown in FIG. 1, the redundancy address decoders 200A–D receive two of the thirteen row address signals. The bank control logic 106 activates one of the redundancy address decoders 200A–D corresponding to the received bank address BA<1:0>. The activated redundancy address decoder 200A–D performs the address comparison and determines whether the column address has been mapped to redundant column memory. If so, the activated redundancy address decoder 200A–D generates a match signal MATCH that is provided to the corresponding activated column decoder 116A–D so that the column accessed for the memory block in which the activated row is located is the redundant column of memory. The address comparison operation performed by the redundancy address decoders 200A–D is similar to conventional redundancy address decoders. However, as will be discussed in greater detail below, unlike conventional redundancy address decoders, switching currents resulting from unnecessary address comparisons are avoided by the redundancy address decoders 200A–D.

During data read operations, data being read from the addressed memory cells is coupled through the I/O gating and data masking circuit 118 to a data output register 124. In response to an internal clock signal that is synchronized with an external clock signal CLK applied to the memory device 100, the data output register 124 sequentially outputs data DQ in synchronism with a rising or falling edge of the CLK signal onto a data bus 126. During data write operations, an external circuit such as a memory controller (not shown) applies data DQ, on the data bus 126 and a corresponding data masking signal DQM to the memory device 100. The data DQ are input to a data input register 128 in synchronism with a rising or falling edge of the CLK signal or a data strobe signal DQS (not shown). The data is then clocked out of the data input register 128 and is applied to the I/O gating and masking circuit 118. The DQM signal is applied to the I/O gating and masking circuit 118 as well. The I/O gating and masking circuit 118 transfers the data DQ to the addressed memory cells in the accessed bank 112A–D subject to the DQM signal, which may be used to selectively mask bits or groups of bits in the data DQ (i.e., in the write data) being written to the addressed memory cells.

A control logic and command decoder 134 receives a plurality of command and clocking signals over a control bus CONT, typically from an external circuit such as a memory controller (not shown). The command signals include a chip select signal CS*, a write enable signal WE*, a column address strobe signal CAS*, and a row address strobe signal RAS*, while the clocking signals include complementary clock signals CLK, CLK*, with the "*" designating a signal as being active low. The command signals CS*, WE*, CAS*, and RAS* are driven to values corresponding to a particular command, such as a read, write, or auto-refresh command. In response to the clock signals CLK, CLK*, the command decoder 134 latches and decodes an applied command, and generates a sequence of clocking and control signals that control the components 102–128 to execute the function of the applied command.

The command decoder 134 latches command and address signals at positive edges of the CLK, CLK* signals (i.e., the crossing point of CLK going high and CLK* going low), while the data input registers 128 and data output register 124 transfer data into and from, respectively, the memory device 100 in synchronicity with both edges of the CLK, CLK* signal, which is thus at double the frequency of the clock signals CLK, CLK*. The memory device 100 is referred to as a double-data-rate device because the data DQ being transferred to and from the device are transferred at double the rate of a conventional SDRAM, which transfers data at a rate corresponding to the frequency of the applied clock signal. The detailed operation of the control logic and command decoder 134 in generating the control and timing signals is conventional, and thus, for the sake of brevity, will not be described in more detail.

Figure 2:
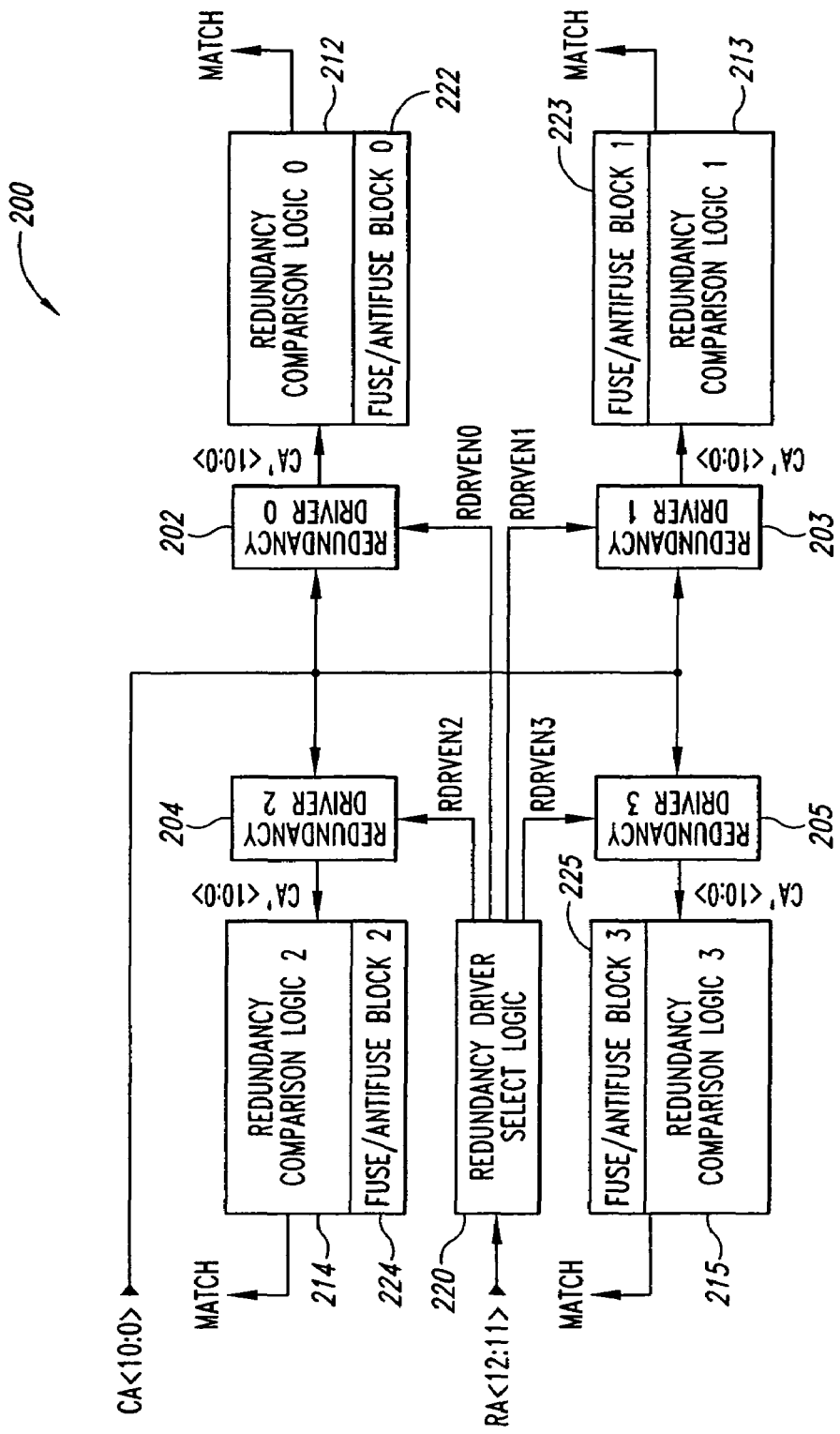
FIG. 2 is a functional block diagram of a redundancy address decoder according to an embodiment of the present invention.

FIG. 2 illustrates a redundancy decoder 200 for column redundancy memory of a bank of memory that can be substituted into the memory device 100 of FIG. 1. The redundancy decoder 200 receives the column address signals CA<10:0> from the column address counter/latch 114 (FIG. 1) and is applied to four redundancy drivers 202–205. Each of the redundancy drivers 202–205 is coupled to a respective redundancy comparison logic 212–215 and provides gated column address signals CA'<10:0> to the respective redundancy comparison logic 212–215 when activated by a redundancy driver select logic 220. The redundancy driver select logic 220 activates one of the redundancy drivers 202–205 based on a portion of the row address signals RA<12:0> and provides the CA'<10:0> signals to the respective redundancy comparison logic 212–215. That is, the redundancy driver select logic 220 generates a redundancy driver enable signal RDRVENn that allows for the respective redundancy driver 202–205 to provide the CA'<10:0> signals to the respective redundancy comparison logic 212–215.

In response to receiving the CA'<10:0> signals, the redundancy comparison logic 212–215 compares the CA'<10:0> signals with the addresses programmed in a respective antifuse block 222–225. It will be appreciated that each of the redundancy drivers 202–205, redundancy comparison logic 212–215, and antifuse blocks 222–225 is associated with a redundancy plane of a respective memory block. As previously discussed, a bank of memory is typically segmented into blocks of memory, each of which has its own redundancy plane. The redundancy decoder 200 is shown as having four sets of redundancy drivers, redundancy comparison logic, and antifuse blocks. Consequently, the redundancy decoder 200 is suitable for use with a bank of memory that is segmented into four memory banks with each memory bank associated with a respective redundancy plane.

As shown in FIG. 2, row address signals RA<12:11> are provided to the redundancy driver select logic 220 to activate one of the four redundancy drivers 202–205. The RA<12:11> signals are indicative of the memory block in which a row of memory will be activated. Thus, providing the RA<12:11> signals to the redundancy driver select logic 220 allows for the activation of the redundancy driver 202–205 for only the memory block in which the activated row of memory is located. Consequently, comparison of the CA'<10:0> signals is limited to the programmed addresses of the antifuse bank 222–225 of the redundancy plane associated with the memory block having the activated row of memory. In this manner, unnecessary switching current from comparing the CA'<10:0> signals in the other three redundancy comparison logic can be avoided.

It will be appreciated that the functional blocks of the redundancy decoder 200 can be implemented using conventional circuits and technologies well known to those ordinarily skilled in the art. Thus, detailed description of conventional circuits have been omitted from herein in order to avoid unnecessarily obscuring the present invention. For example, the circuitry and design of a suitable redundancy comparison logic 212–215 for comparing the CA'<10:0> signals to programmed addresses in the respective antifuse blocks 222–225 is well known.

In operation, bank address signals BA<1:0> are provided to the memory device to activate a bank of memory and row address signals RA<12:0> are decoded to select a row of memory in a memory block corresponding to the RA<12:0> signals for the activated bank of memory. As previously discussed, and as will be explained in more detail below, some of the RA<12:0> signals are also used by the redundancy decoder 200. In the particular embodiment shown in FIG. 2, RA<12:11> signals are applied to the redundancy driver select logic 220. Column address signals CA<10:0> are then provided to the memory device and latched by the column address counter/latch 114. The CA<10:0> signals are then provided to both the column decoder 116A–D and the redundancy decoder 200A–D (FIG. 1). Operation of the column decoder 116A–D in response to receiving the CA<10:0> signals is conventional, and as previously described. With reference to FIG. 2, the CA<10:0> signals are provided to all four redundancy drivers 202–205 of the activated redundancy decoder 200. At this time, the RA<12:11> signals have already been provided to the redundancy driver select logic 220 for the activation of one of the redundancy drivers 202–205. Only the activated redundancy driver 202–205 will provide the CA'<10:0> signals to the respective redundancy comparison logic 212–215.

For the purpose of providing an example, it will be assumed that the RA<12:11> signals represent the binary value "01". In this case, the redundancy driver select logic 220 generates an active RDRVEN1 signal, while the RDRVEN0, RDRVEN2, and RDRVEN3 signals remain inactive. In response to the active RDRVEN1 signal, the redundancy driver 203 gates the CA<10:0> signals to be provided as the CA'<10:0> signals to the redundancy comparison logic 213. Comparison of the CA'<10:0> signals to the programmed addresses of the antifuse block 223 is then performed by the redundancy comparison logic 213. If the CA'<10:0> signals represents a column address that matches one of the programmed addresses, an active MATCH signal is generated. Otherwise, the MATCH signal remains inactive, indicating that the CA'<10:0> signals do not match any of the programmed addresses.

The MATCH signal is provided to the column decoder 116A–D (FIG. 1), which during the address comparison process has already decoded the CA<10:0> signals to the extent that the actual column of memory cells corresponding to the CA<10:0> signals is ready to be activated. In the event an active MATCH signal is generated by the redundancy comparison logic 213, indicating that the requested column of memory has been remapped to a redundant column of memory, the column decoder does not select the "actual" column of memory cells, but instead, selects the redundant column of memory cells to which the requested column (i.e., represented by the CA<10:0> signals) has been mapped. However, if the MATCH signal remains inactive, indicating that the requested column of memory has not been remapped, the column decoder selects the actual column of memory cells. Access to the memory location corresponding to the RA<12:0> and CA<10:0> signals then proceeds in a conventional manner.

In summary, as illustrated by the previous example, the comparison of the requested memory address, represented by the CA<10:0> signals, to the programmed memory addresses of an antifuse block is made only for the memory block in which the row corresponding to the row address signals RA<12:0> is located. As previously described, only the redundancy driver 202–205 associated with the memory block in which the activated row is located is activated by the redundancy driver select logic 220 through the use of a portion of the RA<12:0> signals. In the embodiment illustrated and described with respect to FIG. 2, the RA<12:11> signals are used to select one of the four redundancy drivers 202–205 to provide the CA<10:0> signals to the respective redundancy comparison logic 212–215 for comparison. The other redundancy drivers remain inactive, thereby avoiding the unnecessary switching current that results from conventional redundancy decoder operation.

It will be appreciated that although the previously described embodiment was described with respect to column redundancy, embodiments of the present invention can be also used for row redundancy as well, where applicable, without departing from the scope of the present invention. Those ordinarily skilled in the art will obtain sufficient understanding from the description provided herein to make such modifications as needed to practice embodiments of the present invention as applied to row redundancy. It will be further appreciated that the specific number of address signals used to determine the particular redundancy driver 202–205 to activate, and the specific number of address signals representing the column address are not intended to limit the invention to the particular embodiment. Those ordinarily skilled in the art will appreciate that the number of address signals representing the row and column addresses are details that can be modified without departing from the scope of the present invention.

Figure 3:
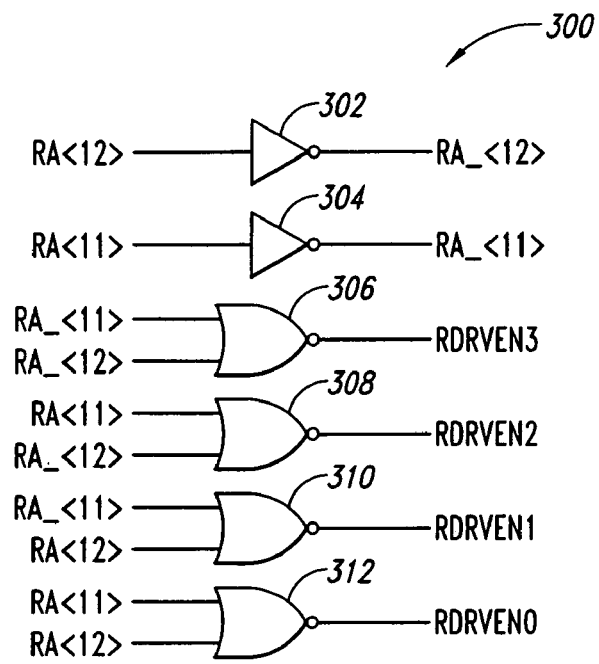
FIG. 3 is a logic gate diagram of a portion of a redundancy driver select circuit according to an embodiment of the present invention.

FIG. 3 illustrates a portion of a redundancy driver select logic 300 according to an embodiment of the present invention. The redundancy driver select logic 300 can be substituted for the redundancy driver select logic 220 shown in FIG. 2. The redundancy driver select logic 300 includes the logic gates shown in FIG. 3 for the generation of redundancy driver enable signals RDRVENn that are used to select particular redundancy drivers 202–205 (FIG. 2) for activation. First and second inverters 302, 304 are included to generate complementary address signals RA_<12:11> from the RA<12:11> signals, respectively. The four resulting address signals RA<12:1> and RA_<12:11> are used in combination to identify which of the redundancy drivers 202–205 to activate. In the redundancy driver select logic 300, the different combinations of the four address signals are provided to a respective NOR gate, 306, 308, 310, 312, each of which provides one of the RDRVENn signals. In FIG. 3, the NOR gate 306 provides the RDRVEN3 signal, the NOR gate 308 provides the RDRVEN2 signal, the NOR gate 310 provides the RDRVEN1 signal, and the NOR gate 312 provides the RDRVEN0 signal.

Using the previous example for illustration of the operation of the redundancy driver select logic 300, that is, the RA<12:11> signals represent the binary value "01", it is apparent that only the RDRVEN1 signal will be active. More specifically, only the NOR gate 310 will generate an active output signal, while the output signals of the other NOR gates, 306, 308, 312 will remain inactive. Consequently, only the redundancy driver 202–205 coupled to the output of the NOR gate 310 will provide the CA<10:0> signals to its respective redundancy comparison logic 212–215 for comparison with the programmed addresses of the antifuse block 222–225 to which the redundancy comparison logic 212–215 is coupled.

Figure 4:
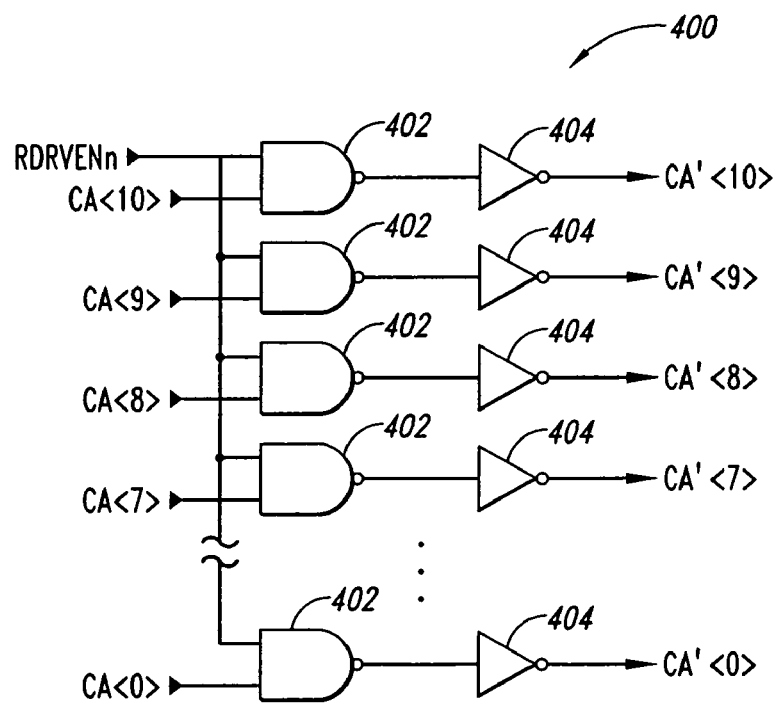
FIG. 4 is a logic gate diagram of a portion of a redundancy driver circuit according to an embodiment of the present invention.

FIG. 4 illustrates a portion of a redundancy driver 400 according to an embodiment of the present invention. The redundancy driver 400 can be substituted for the redundancy drivers 202–205 of FIG. 2. The redundancy driver 400 includes NAND gates 402, each receiving as input signals a respective signal of the column address signals CA<10:0> and the redundancy driver enable signal RDRVENn. The output of each of the NAND gates 402 is coupled to an inverter 404, resulting in essentially an AND operation with the RDRVENn signal controlling whether the respective address signal is provided to the redundancy comparison logic 212–215 for comparison. That is, when the RDRVENn signal is inactive, the output of the respective inverter remains LOW, even if the address input to the respective NAND gate 402 is changing. Thus, where address comparison with the programmed addresses of the antifuse block 222–225 is unnecessary for the memory block associated with the redundancy driver 202–205, unnecessary switching current can be avoided. In contrast, when the RDRVENn signal is active, the output of the inverters 404 will change with the input address signal, and the redundancy comparison logic 212–215 coupled to the outputs of the inverters 404 will be able to perform the address comparison operation. As a result, the address comparison operation can be limited to only those memory blocks selected.

It will be appreciated that the redundancy driver selection logic 300 (FIG. 3) and the redundancy driver 400 (FIG. 4) have been provided by way of example, and that alternative implementations can be used without departing from the scope of the present invention. Those ordinarily skilled in the art will have sufficient understanding of the operation of the redundancy driver selection logic and redundancy driver to enable the invention to be practiced.

Figure 5:
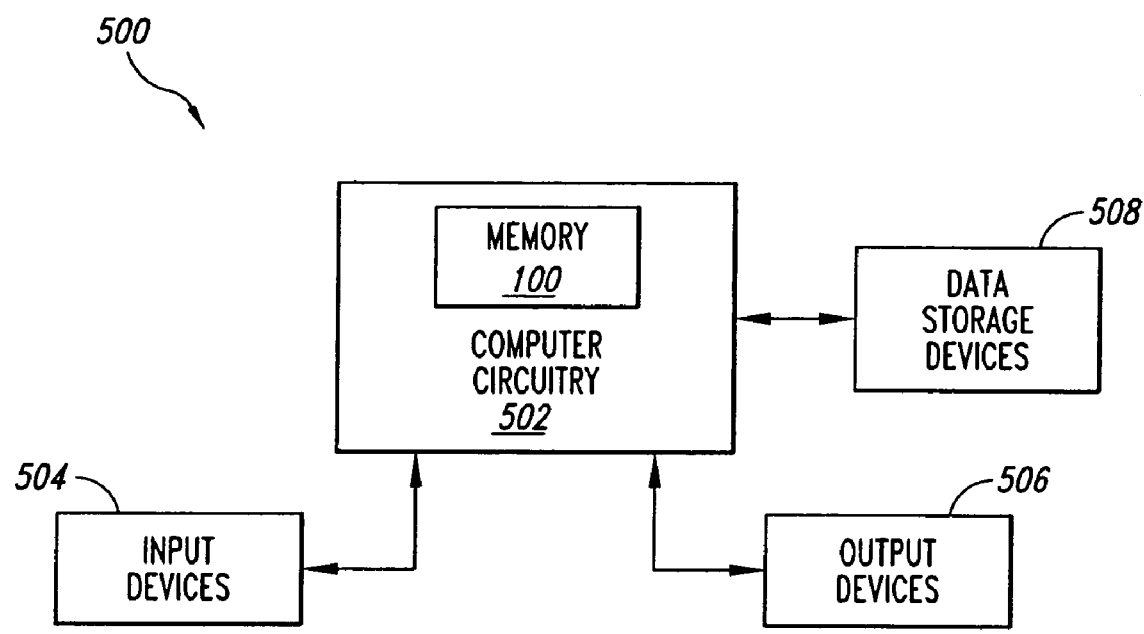
FIG. 5 is a functional block diagram of a computer system including a synchronous memory device of FIG. 1.

FIG. 5 is a block diagram of a computer system 500 including computer circuitry 502 including the memory device 100 of FIG. 1. Typically, the computer circuitry 502 is coupled through address, data, and control buses to the memory device 100 to provide for writing data to and reading data from the memory device. The computer circuitry 502 includes circuitry for performing various computing functions, such as executing specific software to perform specific calculations or tasks. In addition, the computer system 500 includes one or more input devices 504, such as a keyboard or a mouse, coupled to the computer circuitry 502 to allow an operator to interface with the computer system. Typically, the computer system 500 also includes one or more output devices 506 coupled to the computer circuitry 502, such as output devices typically including a printer and a video terminal. One or more data storage devices 508 are also typically coupled to the computer circuitry 502 to store data or retrieve data from external storage media (not shown). Examples of typical storage devices 508 include hard and floppy disks, tape cassettes, compact disk read-only (CD-ROMs) and compact disk read-write (CD-RW) memories, and digital video disks (DVDs).

From the foregoing it will be appreciated that, although specific embodiments of the invention have been described herein for purposes of illustration, various modifications may be made without deviating from the spirit and scope of the invention. For example, the addresses of memory locations that have been remapped to redundant memory locations have been described as being programmed through the use of antifuses. However, embodiments of the present invention include the use of fuses for programming the address locations as well. Such modifications can be made to the previously described embodiments without departing from the scope of the present invention. Accordingly, the invention is not limited except as by the appended claims.

The invention claimed is:

1. A memory system, comprising:
   a memory array having memory locations arranged in addressable rows and columns, the memory array partitioned into a plurality of blocks of memory;
   a corresponding plurality of sets of programmable elements, each set of programmable elements operable to store memory addresses of defective memory locations of a respective block of memory;
   a redundant memory having memory locations to which memory addresses of defective memory locations of the memory array are mapped; and
   an address decoder coupled to the memory array, the redundant memory, and the plurality of sets of programmable elements, the address decoder operable to compare a first portion of a memory address to the memory addresses stored by a selected set of programmable elements, the set of programmable elements selected in accordance with a second portion of the memory address, the address decoder further operable to access memory locations of the redundant memory in response to the memory address matching a stored memory address in the selected sets of programmable elements.

2. The memory system of claim 1 wherein the memory addresses comprise a row address portion and a column address portion and the first portion of the memory address corresponds to at least a portion of the column address portion and the second portion of the memory address corresponds to at least a portion of the row address portion.

3. The memory system of claim 1 wherein the redundant memory comprises a plurality of portions of redundant memory, each portion associated with a respective one of the blocks of memory and defining a respective redundancy plane.

4. The memory system of claim 1 wherein the address decoder comprises:
   a plurality of redundancy driver circuits, each driver circuit associated with a respective one of the blocks of memory and operable to generate a comparison memory address from the first portion of the memory address when enabled;
   a plurality of comparison circuits, each comparison circuit associated with a set of programmable elements and coupled to a respective one of the driver circuits, the comparison circuits operable to compare the comparison memory address from the respective driver circuit with the stored memory addresses of the associated set of programmable elements;
   a driver selection circuit coupled to the plurality of redundancy driver circuits and operable to select which of the redundancy driver circuits to enable based on the second portion of the memory address.

5. The memory system of claim 4 wherein the driver circuits are operable to generate a comparison memory address based on the first portion of the memory address when enabled and generate a comparison memory address having a value independent of the first portion of the memory address when not enabled.

6. The memory system of claim 1 wherein each set of programmable elements comprises a block of antifuses associated with a respective one of the blocks of memory.

7. The memory system of claim 1 wherein the blocks of memory are all associated with a same bank of memory.

8. A redundancy address decoder for a memory having at least one bank of memory segmented into a plurality of memory blocks, each memory block having a set of programmable elements associated therewith for storing programmed addresses that are mapped to redundant memory, the redundancy address decoder comprising:
   a plurality of address comparison circuits operable to compare a first portion of a memory address to the programmed address of the respective programmable element blocks and further operable to generate a match signal in response to detecting an address match with one of the programmed addresses;
   a plurality of address driver circuits, each driver circuit associated with a respective one of the comparison circuits and operable to provide the first portion of the memory address to the respective address comparison circuits when enabled; and
   driver select logic coupled to the plurality of address driver circuits and operable to enable a selected one of the address driver circuits in accordance with a second portion of the memory address.

9. The redundancy address decoder of claim 8 wherein the memory address is represented by memory address signals and the address driver circuits comprise logic circuitry operable to block the switching of the logic states of memory address signals provided to the respective comparison circuit when not enabled and further operable to allow the switching of logic states of the memory address signals provided to the respective comparison circuit when enabled.

10. The redundancy address decoder of claim 8 wherein the programmable element blocks comprise a plurality of antifuse elements programmed with column addresses of memory locations mapped to redundant memory.

11. The redundancy address decoder of claim 8 wherein the memory address comprises a row address portion and a column address portion and the first portion of the memory address is related to the column address portion and the second portion of the memory address is related to the row address portion.

12. The redundancy address decoder of claim 8 wherein each memory block is associated with redundancy plane having redundant memory and a respective set of programmable elements for storing memory addresses of defective memory locations of the memory block mapped to the redundant memory of the associated redundancy plane.

13. A method for accessing a memory location corresponding to a memory address, the method comprising:
   determining from a first portion of the memory address which block of memory the memory location is located;
   generating a comparison memory address corresponding to a second portion of the memory address for comparison with stored memory addresses corresponding to defective memory locations of the block of memory in which the memory location is located;
   generating null memory addresses from the second portion of the memory address for comparison with the stored memory addresses of defective memory locations in other blocks of memory; and
   in response to the comparison memory address matching any of the stored memory addresses for the block of memory in which the memory location is located, accessing a redundant memory location to which the matching address is mapped, otherwise accessing the memory location in the block of memory corresponding to the memory address.

14. The method of claim 13 wherein the first portion of the memory address is related to a row address of the memory address and the second portion of the memory address is related to a column address of the memory address.

15. The method of claim 13 wherein generating null memory addresses from the second portion of the memory address comprises logically combining the second portion of the memory address with an enable signal having a first logic state.

16. The method of claim 15 wherein generating a comparison memory address from the second portion of the memory address comprises logically combining the second portion of the memory address with the enable signal having a second logic state.

17. The method of claim 13 wherein accessing a redundant memory location to which the matching address is mapped comprises accessing a redundant memory array of a redundancy plane associated with the block of memory in which the memory location is located.

18. A method of comparing a memory address to programmed addresses stored in a plurality of programmable element blocks, the programmed addresses corresponding to defective memory locations in a respective memory block, the method comprising:
   evaluating a portion of a row address of the memory address to identify a memory block;
   comparing at least a portion of a column address of the memory address to the programmed addresses of defective memory locations in the identified memory block;
   comparing a null memory address to the programmed addresses of the defective memory locations in the other memory blocks; and
   generating a match signal in response to the portion of the column address matching one of the programmed addresses corresponding to the defective memory locations in the identified memory block.

19. The method of claim 18 wherein evaluating a portion of a row address comprises generating a plurality of enable signals by logically combining the portion of the row address evaluated.

20. The method of claim 19 wherein the null memory address is generated by logically combining signals representing the portion of the column address with the enable signals having a first logic state.

21. The method of claim 19 wherein comparing at least a portion of a column address of the memory address comprises:
   logically combining the signals representing the portion of the column address with an enable signal having a second logic state to provide a comparison memory address; and
   comparing the comparison memory address with the programmed addresses of defective memory locations in the identified memory block.

* * * * *